(12) United States Patent
Kanaya et al.

(10) Patent No.: US 6,855,565 B2
(45) Date of Patent: Feb. 15, 2005

(54) SEMICONDUCTOR DEVICE HAVING FERROELECTRIC FILM AND MANUFACTURING METHOD THEREOF

(75) Inventors: Hiroyuki Kanaya, Yokohama (JP); Andreas Hilliger, Yokohama (JP)

(73) Assignees: Kabushiki Kaisha Toshiba, Tokyo (JP); Infineon Technologies, AG, Munich (DE)

(*) Notice: Subject to any disclaimer, the term of this patent is extended or adjusted under 35 U.S.C. 154(b) by 0 days.

(21) Appl. No.: 10/706,970

(22) Filed: Nov. 14, 2003

(65) Prior Publication Data

US 2004/0099894 A1 May 27, 2004

Related U.S. Application Data

(62) Division of application No. 10/178,744, filed on Jun. 25, 2002, now Pat. No. 6,677,630.

(51) Int. Cl.[7] .............................................. H01L 21/00
(52) U.S. Cl. ........................... 438/3; 438/238; 438/239; 438/386; 257/295; 257/296
(58) Field of Search ............................ 438/3, 238, 239, 438/250, 386, 393, 399; 257/295, 296

(56) References Cited

U.S. PATENT DOCUMENTS

| | | | |
|---|---|---|---|
| 5,994,153 A | 11/1999 | Nagel et al. | |
| 6,121,649 A | 9/2000 | Kunishima | |
| 6,218,197 B1 | 4/2001 | Kasai | |
| 6,458,602 B1 | 10/2002 | Yunogami et al. | |
| 6,500,677 B2 | 12/2002 | Bergmann et al. | |
| 6,620,672 B1 * | 9/2003 | Dennison et al. | 438/239 |
| 2001/0034106 A1 | 10/2001 | Moise et al. | |
| 2002/0000585 A1 | 1/2002 | Ozaki | |
| 2002/0038402 A1 | 3/2002 | Kanaya | |

FOREIGN PATENT DOCUMENTS

| | | |
|---|---|---|
| JP | 2000-22010 | 1/2000 |
| JP | 2000-183304 | 6/2000 |
| JP | 2000-349258 | 12/2000 |
| JP | 2002-110932 | 4/2002 |
| JP | 2002-190577 | 7/2002 |
| JP | 2002-217381 | 8/2002 |

* cited by examiner

*Primary Examiner*—David Nelms
*Assistant Examiner*—Long Tran
(74) *Attorney, Agent, or Firm*—Oblon, Spivak, McClelland, Maier & Neustadt, P.C.

(57) ABSTRACT

First and second semiconductor regions are formed separately from each other in a semiconductor substrate. A gate electrode is formed above the semiconductor substrate which lies between the first and second semiconductor regions. An interlayer insulating film is formed on the semiconductor substrate to cover the first and second semiconductor regions and the gate electrode. First and second lower electrodes are formed on the interlayer insulating film. A first contact plug is formed in the interlayer insulating film in contact with the first lower electrode. A second contact plug is formed in the interlayer insulating film in contact with the second lower electrode. A first ferroelectric film is formed on the first lower electrode. A first upper electrode is formed on the first ferroelectric film. A second ferroelectric film is formed on the second lower electrode. A second upper electrode is formed on the second ferroelectric film.

3 Claims, 6 Drawing Sheets

SEMICONDUCTOR DEVICE HAVING FERROELECTRIC FILM AND MANUFACTURING METHOD THEREOF

CROSS-REFERENCE TO RELATED APPLICATIONS

This application claims benefit of priority under 35 USC §120 and is a divisional of U.S. application Ser. No. 10/178,744, filed Jun. 25, 2002, now U.S. Pat. No. 6,667,630, the entire contents of each of which are incorporated herein by reference in their entirety.

BACKGROUND OF THE INVENTION

1. Field of the Invention

This invention relates to a semiconductor device having a ferroelectric film and a manufacturing method thereof and more particularly to a ferroelectric capacitor in a ferroelectric memory (FeRAM).

2. Description of the Related Art

Recently, as semiconductor memories, volatile DRAMs (Dynamic RAMs), SRAMs (Static RAMs), nonvolatile MROMs (Mask ROMs), Flash EEPROMs and ferroelectric memories (FeRAMs) are on the market.

The ferroelectric memory stores binary data in a nonvolatile fashion depending on the magnitude of two different residual dielectric polarizations of a ferroelectric capacitor based on the hysteresis characteristic which is one of the characteristics of a ferroelectric material.

Like in the case of a DRAM, some of the memory cells which configure a conventional ferroelectric memory are each configured by serially connecting a capacitor and a transistor. In such a ferroelectric memory, a ferroelectric capacitor can be formed by performing a photolithography process once. That is, an upper electrode and lower electrode of the ferroelectric capacitor and a ferroelectric film between the upper and lower electrodes can be formed by performing a photolithography process once. The photolithography process indicates a process in which a resist film is formed, a resist pattern is formed by exposure and development and a to-be-coated film under the resist pattern is formed by use of the resist pattern.

Further, some other memory cells which configure another conventional ferroelectric memory have the following configuration.

A series connected TC unit type ferroelectric memory comprises series connected memory cells each having a transistor (T) having a source and a drain and a ferroelectric capacitor (C) inbetween the source and the drain.

FIG. 1A is a plan view of a ferroelectric capacitor in the conventional series connected TC unit type ferroelectric memory and FIG. 1B is a cross sectional view showing the structure of the ferroelectric capacitor.

As shown in FIG. 1B, source and drain diffusion layers 102 are separately formed in the surface region of a semiconductor substrate 101. A gate electrode 104 of each cell transistor is formed over a portion of the semiconductor substrate 101 which lies between the source and drain diffusion layers 102 with a gate insulating film 103 interposed between the portion of the semiconductor substrate 101 and the gate electrode 104.

An interlayer insulating film 105 is formed on the semiconductor substrate 101. A lower electrode 106, a ferroelectric film 107 and upper electrodes 108 which configure the ferroelectric capacitors are formed in this order in the interlayer insulating film 105.

The ferroelectric film 107 is formed on the lower electrode 106. Two separated upper electrodes 108 are formed on the ferroelectric film 107. Further, the lower electrode 106 is connected to a corresponding one of the source and drain diffusion layers 102 and one of the two upper electrode 108 is connected to the other of the source and drain diffusion layers 102.

Thus, the ferroelectric capacitor of the ferroelectric memory has a structure in which one pair of upper electrodes 108 are disposed over one lower electrode 106.

In the series connected TC unit type ferroelectric memory as shown in FIGS. 1A and 1B, since a structure in which one pair of upper electrodes 108 are disposed over one lower electrode 106 is formed as described before, it is necessary to perform the photolithography process at least twice in order to form a capacitor having one lower electrode 106 and one pair of upper electrodes 108.

More specifically, the following process is performed. In the conventional series connected TC unit type ferroelectric memory, upper electrodes 108 are formed by use of a first mask. Then, after a second mask is formed to protect each pair of upper electrodes 108, ferroelectric films 107 and lower electrodes 106 are formed.

In the process using two mask steps, misalignment occurs between the first and second masks. Therefore, as shown in FIG. 1A, it is necessary to provide a margin of a misalignment portion 109 between the upper electrode 108 formed by use of the first mask and the lower electrode 106 formed by use of the second mask. As a result, the cell area of the capacitor is increased by an amount corresponding to the misalignment portion and there occurs a problem that the occupied area on the chip of the ferroelectric memory having the capacitors incorporated therein is increased.

BRIEF SUMMARY OF THE INVENTION

According to an aspect of the present invention, there is provided a semiconductor device comprising a first semiconductor region formed in a surface region of a semiconductor substrate; a second semiconductor region formed separately from the first semiconductor region in a surface region of the semiconductor substrate; a gate insulating film formed on a portion of the semiconductor substrate which lies between the first semiconductor region and the second semiconductor region; a gate electrode formed on the gate insulating film; an interlayer insulating film formed on the semiconductor substrate to cover the first semi-conductor region, second semiconductor region and gate electrode; first and second lower electrodes formed on the interlayer insulating film; a first contact plug formed in the interlayer insulating film in contact with the first lower electrode; a second contact plug formed in the interlayer insulating film separately from the first contact plug and in contact with the second lower electrode; a first ferroelectric film formed on the first lower electrode; a first upper electrode formed on the first ferroelectric film; a second ferroelectric film formed on the second lower electrode; and a second upper electrode formed on the second ferroelectric film.

According to another aspect of the present invention, there is provided a semiconductor device manufacturing method comprising forming a gate electrode over a semiconductor substrate with a gate insulating film interposed between the semiconductor substrate and the gate electrode; forming source and drain diffusion layers on a surface of the semi-conductor substrate on both sides of the gate electrode; forming a first interlayer insulating film on the semiconductor substrate to cover the gate electrode, source and drain diffusion layers; forming a buried interconnection and a first contact plug which extends from a portion of the buried interconnection to one of the source diffusion layer and the drain diffusion layer in the first interlayer insulating film which lies on the source and drain diffusion layers; forming a second interlayer insulating film on the first interlayer insulating film and on the buried interconnection containing the first contact plug; forming a pair of second and third contact plugs which extend from the surface of the second interlayer insulating film to the buried interconnection in the second interlayer insulating film formed on the buried interconnection; and forming a first ferroelectric capacitor by sequentially laminating a first lower electrode, first ferroelectric film and first upper electrode in this order on the second contact plug and forming a second ferroelectric capacitor by sequentially laminating a second lower electrode, second ferroelectric film and second upper electrode in this order on the third contact plug.

DETAILED DESCRIPTION OF THE INVENTION

Figure 1A:
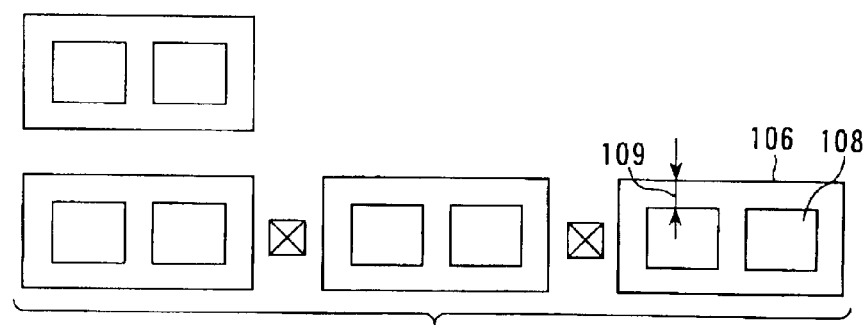
FIG. 1A is a plan view of ferroelectric capacitors of the conventional series connected TC unit type ferroelectric memory.
Figure 1B:
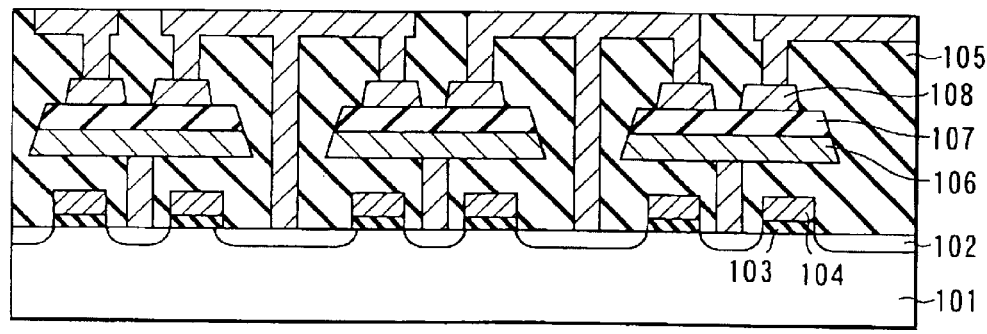
FIG. 1B is a cross sectional view showing the structure of the ferroelectric capacitors.

There will now be described embodiments of this invention with reference to the accompanying drawings. In the following explanation, common portions in the drawings are denoted by the same reference symbols.

A semiconductor device described in this specification is a ferroelectric memory having cell transistors and ferroelectric capacitors. The ferroelectric memory is a series connected TC unit type ferroelectric memory that comprises series connected memory cells each having a transistor (T) having a source and a drain and a ferroelectric capacitor (C) inbetween the source and the drain.

First Embodiment

First, a ferroelectric memory according to a first embodiment of this invention and a manufacturing method thereof are explained.

Figure 2A:
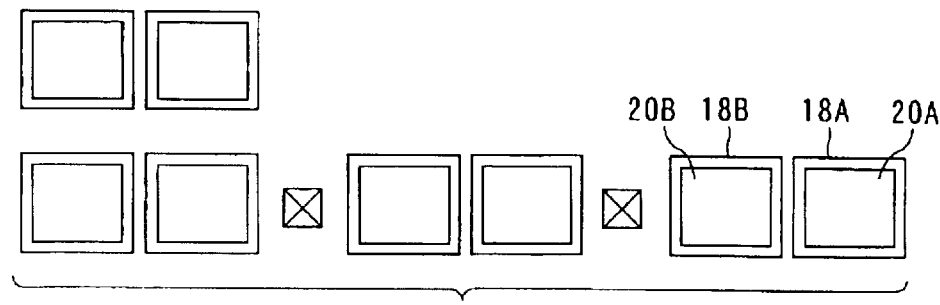
FIG. 2A is a layout view of ferroelectric capacitors of a ferroelectric memory according to a first embodiment of this invention.
Figure 2B:
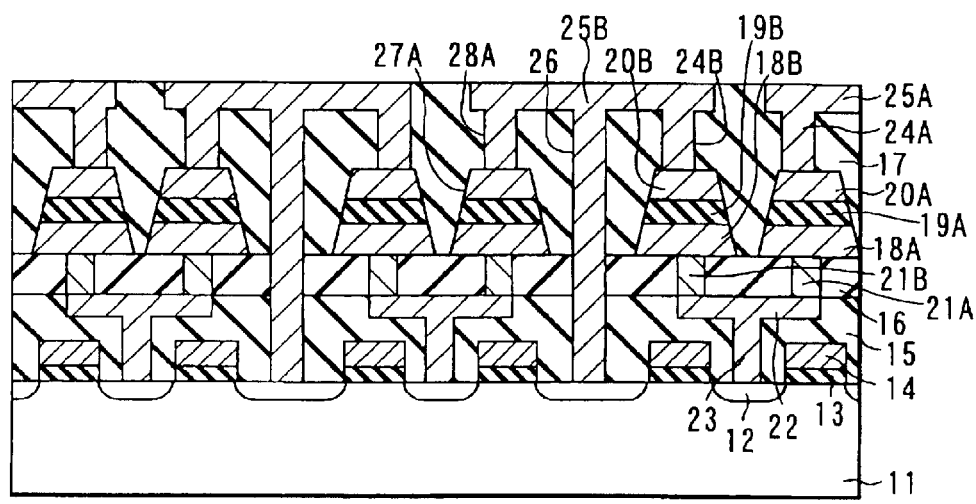
FIG. 2B is a cross sectional view showing the structure of the ferroelectric memory of the first embodiment.

FIG. 2A is a layout view of ferroelectric capacitors of the ferroelectric memory according to the first embodiment. FIG. 2B is a cross sectional view showing the structure of the ferroelectric memory.

As shown in FIG. 2B, source and drain diffusion layers 12 are separately formed in the surface region of a semiconductor substrate 11. Each of gate insulating films 13 is formed on a portion of the semiconductor substrate 11 which lies between the source and drain diffusion layers 12. Gate electrodes 14 of cell transistors are formed on the respective gate insulating films 13.

An interlayer insulating film 15 is formed on the semiconductor substrate 11 to cover the gate electrodes 14. Interlayer insulating films 16 and 17 are sequentially formed on the interlayer insulating film 15. In the interlayer insulating film 17 formed on the interlayer insulating film 16, lower electrodes 18A and 18B, ferroelectric films 19A and 19B and upper electrodes 20A and 20B which configure first and second ferroelectric capacitors are formed in this order. The first ferroelectric capacitor and the second ferroelectric capacitor configure one pair of ferroelectric capacitors in the series connected TC unit type ferroelectric memory. As the lower electrode, a film containing Ir, IrOx, Pt or TiN is used, for example. As the ferroelectric film, for example, a PZT film is used, and as the upper electrode, a film containing Pt, Ir or IrOx is used, for example.

In portions of the interlayer insulating film 16 which lie under the lower electrodes 18A, contact plugs 21A are formed in contact with the lower electrodes 18A. In portions of the interlayer insulating film 16 which lie under the lower electrodes 18B, contact plugs 21B are formed in contact with the lower electrodes 18B. Further, in portions of the interlayer insulating film 15 which lie under the contact plugs 21A and 21B, buried interconnections 22 each of which is connected to both of the corresponding contact plugs 21A and 21B are formed. In portions of the interlayer insulating film 15 which lie under the buried interconnections 22, contact plugs 23 respectively connected to the buried interconnections 22 are formed. Each of the contact plugs 23 is electrically connected to one of the source and drain diffusion layers 12.

That is, the lower electrode 18A among one pair of the lower electrodes 18A and 18B in one pair of ferroelectric capacitors is electrically connected to the diffusion layer 12 via a current passage which is configured by the contact plug 21A, buried interconnection 22 and contact plug 23. Likewise, the lower electrode 18B is electrically connected to the diffusion layer 12 via a current passage which is configured by the contact plug 21B, buried interconnection 22 and contact plug 23. For example, tungsten (W) or polysilicon is used to form the contact plugs 21A, 21B, 23 and buried interconnections 22.

Further, in portions of the interlayer insulating film 17 which lie on the upper electrodes 20A, contact plugs 24A are formed and interconnections 25A are formed on the respective contact plugs 24A. In portions of the interlayer insulating film 17 which lie on the upper electrodes 20B, contact plugs 24B are formed and interconnections 25B are formed on the respective contact plugs 24B.

In portions of the interlayer insulating films 17, 16, 15 which lie between the interconnections 25B and corresponding diffusion layers 12, contact plugs 26 are respectively formed and each of the interconnections 25B is electrically connected to a corresponding one of the diffusion layers 12 via the contact plug 26. Further, each of the interconnections 25B is connected to an upper electrode 27A of an adjacent ferroelectric capacitor via a contact plug 28A. For example, Al, Cu or an alloy of Al and Cu is used to form the contact plugs 24A, 24B, 26, 28A and interconnections 25A and 25B.

In the ferroelectric memory of the first embodiment, the paired lower electrodes 18A and 18B connected to the same diffusion layer 12 are separately formed. Further, the contact plugs 21A and 21B respectively connected to the paired lower electrodes 18A, 18B are also separately formed.

In the ferroelectric capacitor with the above structure, the upper electrodes 20A and 20B, ferroelectric films 19A and 19B and lower electrodes 18A and 18B can be formed by performing the lithography process using one mask step only. Therefore, it becomes unnecessary to provide a misalignment margin between the upper and lower electrodes, and as shown in FIG. 2A, the distance between the outer periphery of the upper electrode 18A and the outer periphery of the lower electrode 20A can be minimized. As a result, an area required for forming the ferroelectric capacitor can be reduced.

Next, the manufacturing method of the ferroelectric memory of the first embodiment is explained.

FIG. 3 to FIG. 7A, FIG. 7B are cross sectional views showing the steps of the manufacturing method of the ferroelectric memory.

Figure 3:
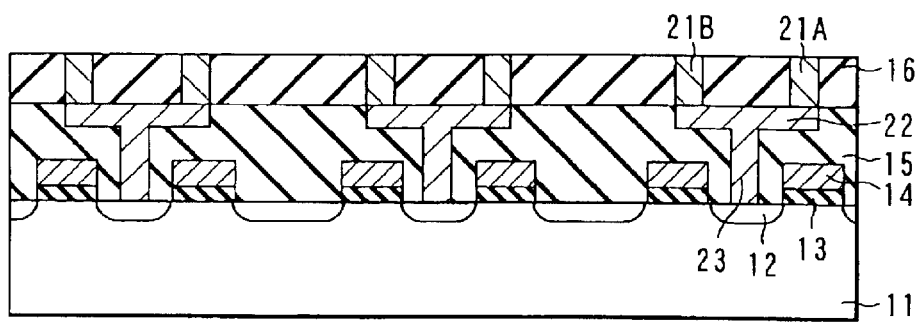
FIG. 3 is a cross sectional view showing a first step of a manufacturing method of the ferroelectric memory of the first embodiment.

For example, a silicon oxide film is formed on a semiconductor substrate 11 and a polysilicon film is formed on the silicon oxide film. Then, as shown in FIG. 3, the silicon oxide film and polysilicon film are patterned to form gate insulating films 13 formed of the silicon oxide film and gate electrodes 14 formed of the polysilicon film on the semiconductor substrate 11. After this, an impurity ion-implantation process is performed with the gate electrodes 14 used as a mask to form diffusion layers 12 which are drain or source regions in the surface region of the semiconductor substrate 11 on both sides of each of the gate electrodes 14.

Next, an interlayer insulating film 15 is formed on the semiconductor substrate 11 to cover the gate electrodes 14 and diffusion layers 12. Then, the interlayer insulating film 15 is planarized by a CMP method. After this, grooves for interconnections are formed in portions of the interlayer insulating film 15 which lie above the diffusion layers 12 by an RIE method, for example. Further, holes are formed in the central portions of the respective interconnection grooves to reach the respective diffusion layers 12. In this case, the holes are formed after the interconnection grooves are formed, but it is also possible to first form the holes and then form the interconnection grooves.

Next, for example, a plug material of tungsten (W) or polysilicon is deposited on the interlayer insulating film 15 having the interconnection grooves and holes formed therein. Then, the plug material on the interlayer insulating film 15 is made flat by the CMP method. As a result, the plug material is buried in the interconnection grooves and holes to reach the diffusion layers 12 so as to form buried interconnections 22 in the interconnection grooves and form contact plugs 23 in the holes.

Next, an interlayer insulating film 16 is formed on the buried interconnections 22 and interlayer insulating film 15. Further, in portions of the interlayer insulating film 16 which lie on each of the buried interconnections 22, a pair of holes are formed. Then, a plug material of tungsten (W) or polysilicon is deposited on the interlayer insulating film 16 having the paired holes formed therein. Then, the plug material on the interlayer insulating film 16 is planarized by the CMP method. As a result, the plug material is buried in the holes to reach the buried interconnections 22 so that contact plugs 21A and 21B can be formed.

Figure 4:
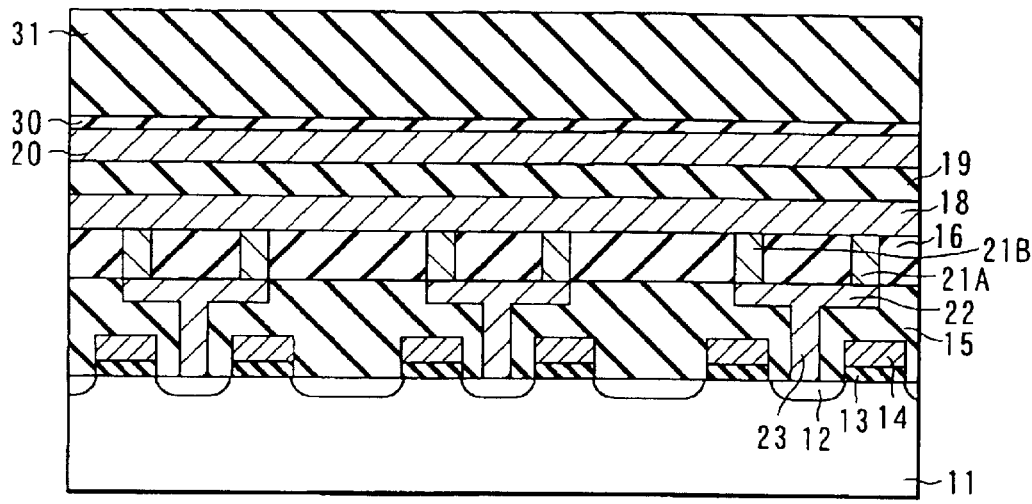
FIG. 4 is a cross sectional view showing a second step of the manufacturing method of the ferroelectric memory of the first embodiment.

After this, as shown in FIG. 4, films 18, 19 and 20 used to respectively configure lower electrodes, ferroelectric films and upper electrodes which configure ferroelectric capacitors are formed in this order on the structure shown in FIG. 3. In this case, as a material of the film used to form the lower electrodes, a material which prevents oxygen generated when the ferroelectric film is crystallized from entering the plug is used. The ferroelectric film is crystallized in an oxygen atmosphere at 600° C. for one minute by using for example RTA (rapid thermal annealing). As described before, as the lower electrode, a film containing Ir, IrOx, Pt or TiN is used, for example. Further, as the ferroelectric film, for example, a PZT film is used, and as the upper electrode, a film containing Pt, Ir or IrOx is used, for example.

Next, an aluminum oxide film 30 is deposited to a film thickness of approx. 100 Å on the film 20 which will be used to form the upper electrodes by use of a sputtering method, for example. Then, the aluminum oxide film 30 is annealed in an oxygen atmosphere at 400° C. so as to be sufficiently oxidized and insulated. Further, a plasma oxide film 31 is formed on the aluminum oxide film 30 by use of a plasma CVD method. The aluminum oxide film 30 is a film which enhances the adhesion between the film 20 used to form the upper electrodes and the plasma oxide film 31 and has the effect that damage caused on the film 20 used to form the upper electrodes when the plasma oxide film 31 is deposited is suppressed. The plasma oxide film 31 is used as a mask when the ferroelectric capacitors, that is, lower electrodes, ferroelectric films and upper electrodes are formed.

Figure 5A:
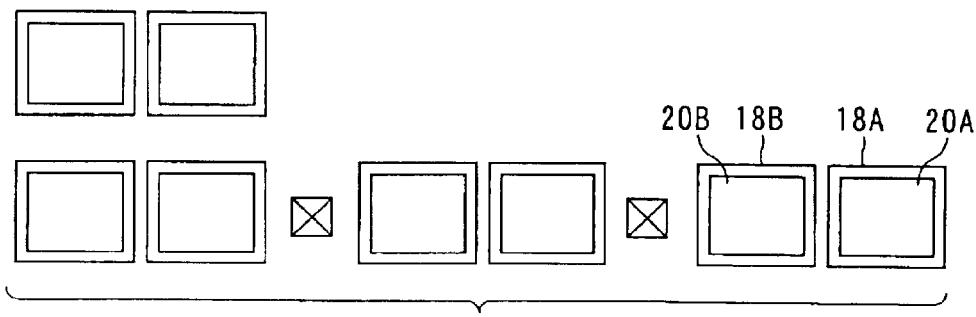
FIGS. 5A and 5B are cross sectional views showing a third step of the manufacturing method of the ferroelectric memory of the first embodiment.
Figure 5B:
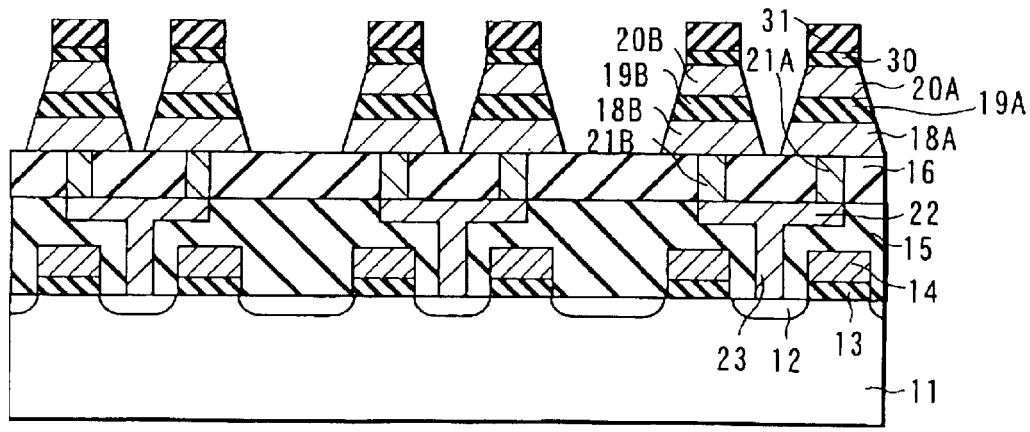

Then, a photoresist pattern is formed so that a pair of ferroelectric capacitors can be formed on each pair of contact plugs 21A and 21B. The plasma oxide film 31 is processed by use of the photoresist pattern. After this, the photoresist pattern is removed by an ashing process. Then, the plasma oxide film 31 is used as a mask to form the upper electrodes 20A and 20B, ferroelectric films 19A and 19B, and lower electrodes 18A and 18B by use of $Ar/Cl_2$-series gas, for example, as shown in FIG. 5B. In this case, the etching rate of the plasma oxide film 31 which is a mask can be minimized by adding oxygen to the above gas and the selective ratio thereof with a capacitor material (upper electrode, ferroelectric film, lower electrode) can be increased.

In the paired capacitors formed by the above forming step, the lower electrodes 18A and 18B may be connected to each other. Thus the paired capacitors operate as is desired, because the paired lower electrodes 18A and 18B are electrically connected via the contact plugs 21A and 21B and buried interconnection 22.

Figure 6A:
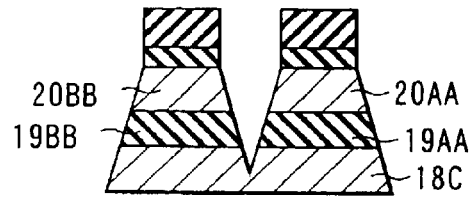
FIGS. 6A and 6B are cross sectional views showing a different step as the third step of the manufacturing method of the ferroelectric memory of the first embodiment.

That is, as shown in FIG. 6A, a structure in which a lower electrode 18C is not divided, upper electrodes 20AA and 20BB are separated from each other, and ferroelectric films 19AA and 19BB are separated from each other may be used.

Figure 6B:
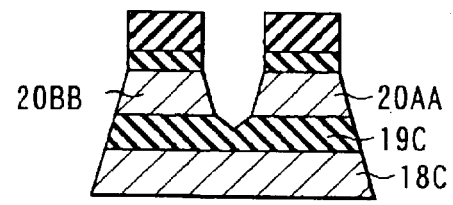

Further, as shown in FIG. 6B, a structure in which a lower electrode 18C is not divided, a ferroelectric film 19C is not divided and only upper electrodes 20AA and 20BB are separated from each other may be used.

Figure 7A:
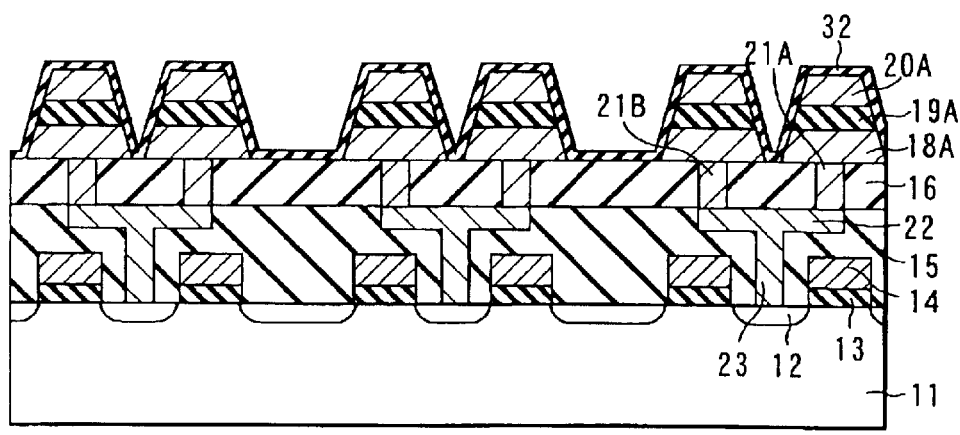
FIGS. 7A and 7B are cross sectional views showing a fourth step of the manufacturing method of the ferroelectric memory of the first embodiment.

Next, as shown in FIG. 7A, an aluminum oxide film 32 is formed to a film thickness of approx. 100 Å on the upper surfaces of the upper electrodes 20A, on the side surfaces of the ferroelectric capacitors formed of the upper electrodes 20A, ferroelectric films 19A and lower electrodes 18A and on the interlayer insulating film 16 after the plasma oxide films 31 and aluminum oxide films 30 on the upper electrodes are removed. The aluminum oxide film 32 has the effect that oxygen is prevented from entering the contact plugs 21A and 21B and oxidation of the contact plugs 21A and 21B is suppressed in an oxygen high-temperature recovery annealing step performed after the present step and damage caused when an interlayer insulating film 17 is deposited on the ferroelectric capacitors is suppressed.

Figure 7B:
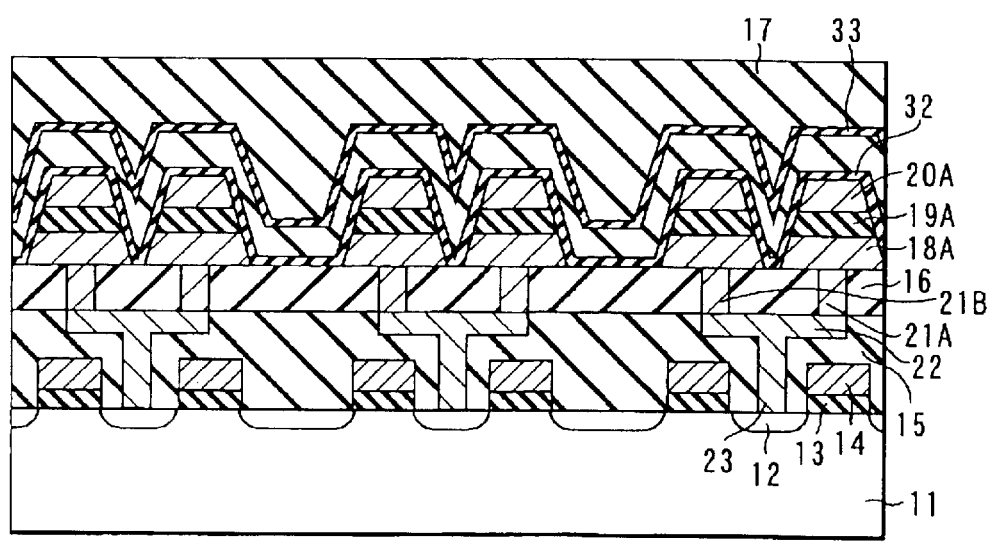

Next, the interlayer insulating film 17 is deposited on the aluminum oxide film 32. Then, the surface of the interlayer insulating film 17 is planarized by the CMP method. As shown in FIG. 7B, an aluminum oxide film 33 may be formed in the interlayer insulating film 17 on the aluminum oxide film 32 when required. If the aluminum oxide film 33 is formed, occurrence of damage caused in the multi-layered interconnection forming step later performed can be prevented. In the drawings other than FIGS. 7A and 7B, the aluminum oxide films 32 and 33 are omitted.

Next, holes reaching the upper electrodes 20A and 20B and holes reaching the diffusion layers 12 are formed in the interlayer insulating film 17. Further, interconnection grooves connected to the above holes are formed in the interlayer insulating film 17. Then, an oxygen high-temperature recovery annealing step is performed. After this, a TiN film is formed in the holes and interconnection grooves and on the interlayer insulating film 17. Al, Cu or an alloy of Al and Cu is deposited on the TiN film to fill the holes and interconnection grooves. Then, the interlayer insulating film 17 is planarized by the CMP method. As a result, as shown in FIG. 2B, contact plugs 24A, 24B, 26, and buried interconnections 25A and 25B are formed.

Figure 8A:
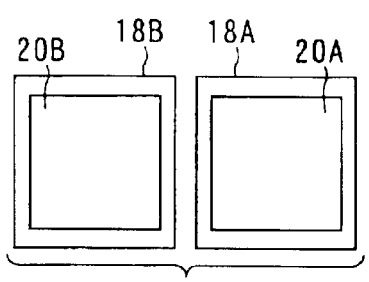
FIG. 8A is a layout view of a ferroelectric capacitor formed by the manufacturing method according to the first embodiment.
Figure 8B:
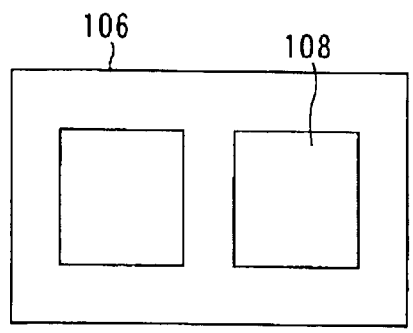
FIG. 8B is a layout view of the conventional ferroelectric capacitor.

The layout diagram of the ferroelectric capacitor formed by the above manufacturing method is shown in FIG. 8A. Further, the layout diagram of the conventional ferroelectric capacitor is shown in FIG. 8B. It is clearly seen from FIGS. 8A and 8B that the area of the capacitor in the first embodiment is smaller than the area of the conventional capacitor. That is, the outer shape size of the lower electrodes 18A and 18B of the capacitor in the first embodiment can be made smaller than the outer shape size of the conventional lower electrode 106. This is because it is unnecessary to set a misalignment margin between the upper and lower electrodes since the upper and lower electrodes of the capacitor in the first embodiment are formed by the same lithography process. Further, the distance between the cell transistors can be made small by reducing the area of the ferroelectric capacitor. As a result, the area of the ferroelectric memory in which a plurality of ferroelectric capacitors and cell transistors are formed can be reduced.

Further, strictly speaking, in the capacitor structure of the conventional series connected TC unit type ferroelectric memory, it is impossible to symmetrically form paired capacitors if the upper and lower electrodes are misaligned, but in the first embodiment, capacitors with exactly the same structure can be formed.

Second Embodiment

Next, a ferroelectric memory according to a second embodiment of this invention is explained. The contact plugs which electrically connect the diffusion layer 12 to one pair of lower electrodes 18A and 18B in the configuration of the first embodiment shown in FIG. 2A are formed into a single contact plug, side wall insulating films are formed on the side wall surfaces of the gate electrode of each cell transistor and a cap insulating film is formed on the upper surface of each gate electrode.

Figure 9:
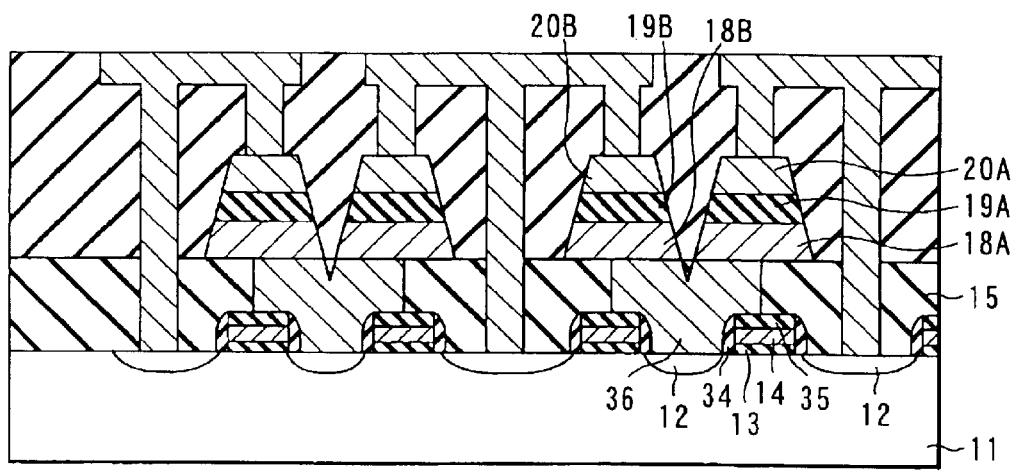
FIG. 9 is a cross sectional view showing the structure of a ferroelectric memory according to a second embodiment of this invention.

FIG. 9 is a cross sectional view showing the structure of the ferroelectric memory according to the second embodiment.

As shown in FIG. 9, source and drain diffusion layers 12 are separately formed in the surface region of a semiconductor substrate 11. Gate insulating films 13 are each formed on a portion of the semiconductor substrate 11 which lies between the source and drain diffusion layers 12. Gate electrodes 14 of cell transistors are formed on the respective gate insulating films 13.

Side wall insulating films 34 are formed on the side wall surfaces of each gate electrodes 14. Further, a cap insulating film 35 is formed on the upper surface of each gate electrodes 14. An interlayer insulating film 15 is formed on the semiconductor substrate 11 to cover the diffusion layers 12 and gate electrodes 14. Pairs of ferroelectric capacitors each pair including first and second ferroelectric capacitors are formed on the interlayer insulating film 15. That is, lower electrodes 18A, ferroelectric films 19A and upper electrodes 20A are sequentially formed in this order from the bottom on the interlayer insulating film 15. Each of the first ferroelectric capacitors is configured by the lower electrode 18A, ferroelectric film 19A and upper electrode 20A. Likewise, lower electrodes 18B, ferroelectric films 19B and upper electrodes 20B are sequentially formed in this order from the bottom on the interlayer insulating film 15. Each of the second ferroelectric capacitors is configured by the lower electrode 18B, ferroelectric film 19B and upper electrode 20B.

Contact plugs 36 are each formed in a portion of the interlayer insulating film 15 which lies between a corresponding one of the diffusion layers 12 and a corresponding one pair of the lower electrodes 18A and 18B. The contact plug 36 electrically connects the diffusion layer 12 to a corresponding one pair of the lower electrodes 18A and 18B. Further, a portion of the contact plug 36 overlaps the cap insulating films 35 on the two gate electrodes 14 which are arranged on both sides of the diffusion layer 12. In the second embodiment, the two lower electrodes 18A and 18B of each pair of ferroelectric capacitors are completely separated.

In the ferroelectric capacitor with the above structure, the upper electrodes 20A and 20B, ferroelectric films 19A and 19B and lower electrodes 18A and 18B can be formed by performing the photolithography process using one mask only. Therefore, it becomes unnecessary to provide a misalignment margin between the upper electrodes 20A and 20B and the lower electrodes 18A and 18B and the distance between the outer periphery of the upper electrode 20A and the outer periphery of the lower electrode 18A can be made small. Likewise, the distance between the outer periphery of the upper electrode 20B and the outer periphery of the lower electrode 18B can be minimized. As a result, the area required for forming the ferroelectric capacitor can be reduced.

Further, since the area of the ferroelectric capacitor can be reduced, the distance between the cell transistors can be made small. As a result, the area of the ferroelectric memory in which a plurality of ferroelectric capacitors and cell transistors are formed can be reduced.

In the second embodiment, since the contact areas between the lower electrodes 18A and 18B and the contact plug 36 can be set large, the electrical resistivity of portions between the lower electrodes 18A and 18B and the contact plug 36 can be made low.

Figure 10:
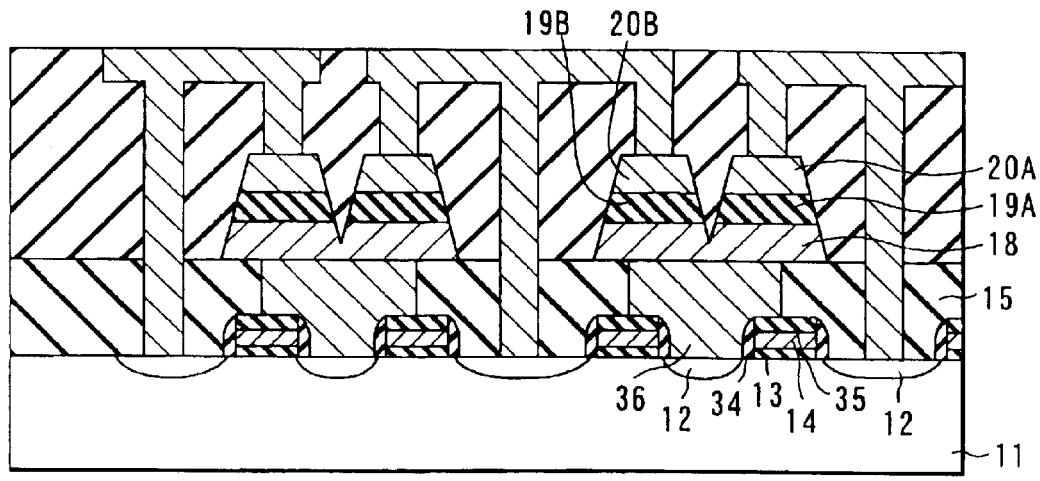
FIG. 10 is a cross sectional view showing the structure of the ferroelectric memory as a first modification of the second embodiment.

Further, as shown in FIG. 10, as a first modification of the second embodiment, a structure in which the two upper electrodes 20A and 20B are completely separated from each other, the ferroelectric films 19A, 19B are completely separated from each other and the lower electrode 18 is not divided in each pair of ferroelectric capacitors can be used.

Figure 11:
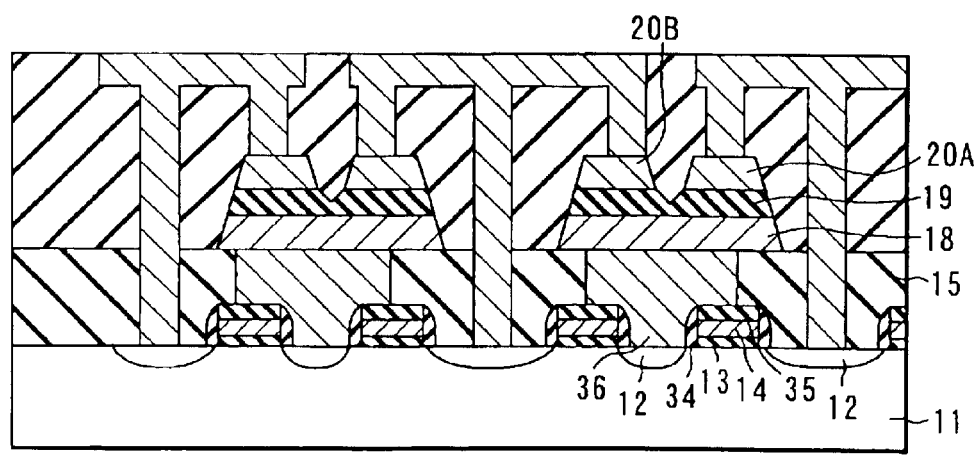
FIG. 11 is a cross sectional view showing the structure of the ferroelectric memory as a second modification of the second embodiment.

As shown in FIG. 11, as a second modification of the second embodiment, a structure in which only the two upper electrodes 20A and 20B are separated from each other and the ferroelectric film 19 and lower electrode 18 are not divided in each pair of ferroelectric capacitors can be used.

In the structures of the first and second modifications, the same effect as that of the second embodiment can be attained. In the second embodiment and in the first and second modifications, an example in which the contact plug 36 formed in contact with the diffusion layer 12 is formed in a self-alignment process with the gate electrodes 14 used as a mask is shown.

In the first and second embodiments and in the modifications of the second embodiment, the following material can be used. A material containing at least one of Pt, Ir, Ru and Sr can be used as the upper electrode. For example, an SRO electrode, RuOx electrode or the like can be used. Further, as the ferroelectric film, for example, PZT, PTO, or BTO or SBT with a layered-form perovskite structure may be used. As the lower electrode, a material containing at least one of Pt, Ir, Ru, Sr, Ti and Al can be used.

Further, each of the above embodiments can be independently carried out or the above embodiments can be adequately combined and carried out. In the above embodiments, inventive concepts of various stages are contained and the inventive concepts of various stages can be extracted by adequately combining a plurality of constituents disclosed in the above embodiments.

As described above, according to the embodiments of this invention, a semiconductor device and a manufacturing method thereof can be provided in which the occupied area of each pair of capacitors on the chip can be made small by forming the paired capacitors by performing the photolithography process once.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

forming a gate electrode over a semiconductor substrate with a gate insulating film interposed between said semiconductor substrate and said gate electrode;

forming source and drain diffusion layers on a surface of said semiconductor substrate on both sides of said gate electrode;

forming a first interlayer insulating film on said semiconductor substrate to cover said gate electrode, source and drain diffusion layers;

forming a buried interconnection and a first contact plug which extends from a portion of said buried interconnection to one of said source diffusion layer and said drain diffusion layer in said first interlayer insulating film which lies on one of said source diffusion layer and said drain diffusion layer;

forming a second interlayer insulating film on said first interlayer insulating film and on said buried interconnection containing said first contact plug;

forming a pair of second and third contact plugs which extend from a surface of said second interlayer insulating film to said buried interconnection in said second interlayer insulating film formed on said buried interconnection; and forming a first ferroelectric capacitor by sequentially laminating a first lower electrode, first ferroelectric film and first upper electrode in this order on said second contact plug and forming a second ferroelectric capacitor by sequentially laminating a second lower electrode, second ferroelectric film and second upper electrode in this order on said third contact plug.

2. The semiconductor device manufacturing method according to claim 1, wherein said first and second lower electrodes are integrally formed, said first and second ferroelectric films are separately formed and said first and second upper electrodes are separately formed.

3. The semiconductor device manufacturing method according to claim 1, wherein said first and second lower electrodes are integrally formed, said first and second ferroelectric films are integrally formed and said first and second upper electrodes are separately formed.

* * * * *